United States Patent
Cazaux

(10) Patent No.: US 9,172,851 B2
(45) Date of Patent: Oct. 27, 2015

(54) CMOS LINEAR IMAGE SENSOR WITH MOTION-BLUR COMPENSATION

(75) Inventor: Yvon Cazaux, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/978,792

(22) PCT Filed: Jan. 9, 2012

(86) PCT No.: PCT/FR2012/000010
§ 371 (c)(1),
(2), (4) Date: Jul. 9, 2013

(87) PCT Pub. No.: WO2012/095582
PCT Pub. Date: Jul. 19, 2012

(65) Prior Publication Data
US 2013/0286266 A1 Oct. 31, 2013

(30) Foreign Application Priority Data
Jan. 10, 2011 (FR) ...................................... 11 00073

(51) Int. Cl.
*H04N 3/14* (2006.01)
*H01L 27/146* (2006.01)
*H04N 5/372* (2011.01)
*H04N 5/374* (2011.01)

(52) U.S. Cl.
CPC ........ *H04N 3/1525* (2013.01); *H01L 27/14603* (2013.01); *H01L 27/14609* (2013.01); *H01L 27/14643* (2013.01); *H04N 3/155* (2013.01); *H04N 5/3743* (2013.01); *H04N 5/37206* (2013.01)

(58) Field of Classification Search
USPC .......................................................... 348/305
See application file for complete search history.

(56) References Cited

U.S. PATENT DOCUMENTS 4,280,141 A  7/1981  McCann et al.
4,870,293 A  9/1989  Elabd
(Continued)

FOREIGN PATENT DOCUMENTS

EP  2 154 879 A1  2/2010
FR  2 906 080 A1  3/2008

OTHER PUBLICATIONS

Tsai et al., "A Time-Delay-Integration CMOS readout circuit for IR scanning"; 2002; IEEE, pp. 347-350.
(Continued)

*Primary Examiner* — Jason Flohre
(74) *Attorney, Agent, or Firm* — Oliff PLC

(57) ABSTRACT

Time delay and integration sensor comprising a matrix of photosensitive pixels organized in rows and columns. Each pixel of a column comprises a photosensitive element, a storage node, and a first transfer transistor connecting the photosensitive element to the storage node. Each pixel of a column, except for the last one, further comprises a second transfer transistor which connects the storage node of the pixel to the photosensitive element of the next pixel of the column. The two transfer transistors are connected to be active at the same time. With such a configuration, it is possible to define a sliding group of several consecutive pixels in a column, to expose the group of pixels, to aggregate the information of the pixels of the group, and to start again after shifting the group of pixels by one pixel.

4 Claims, 5 Drawing Sheets

(56) References Cited

U.S. PATENT DOCUMENTS

| | | | |
|---|---|---|---|
| 5,828,408 | A | 10/1998 | Mottin et al. |
| 6,906,749 | B1 | 6/2005 | Fox |
| 7,268,814 | B1 | 9/2007 | Pain et al. |
| 7,417,243 | B2 | 8/2008 | Katzir et al. |
| 7,638,826 | B2 * | 12/2009 | Hiyama et al. ............... 257/291 |
| 7,675,561 | B2 | 3/2010 | Lepage |
| 7,796,174 | B1 | 9/2010 | Harwit et al. |
| 7,897,902 | B2 | 3/2011 | Katzir et al. |
| 7,952,633 | B2 | 5/2011 | Brown et al. |
| 8,085,327 | B2 | 12/2011 | Schrey et al. |
| 8,119,969 | B2 | 2/2012 | Katzir et al. |
| 2004/0159861 | A1 | 8/2004 | Mori et al. |
| 2005/0083408 | A1 * | 4/2005 | Mabuchi ................. 348/207.99 |
| 2006/0132633 | A1 * | 6/2006 | Nam et al. .................... 348/308 |
| 2006/0146157 | A1 * | 7/2006 | Toros et al. .................. 348/308 |
| 2006/0170804 | A1 * | 8/2006 | Kwon .......................... 348/308 |
| 2006/0181625 | A1 * | 8/2006 | Han et al. ..................... 348/297 |
| 2006/0256221 | A1 | 11/2006 | McKee et al. |
| 2007/0012865 | A1 | 1/2007 | Katzir et al. |
| 2008/0079830 | A1 | 4/2008 | Lepage |
| 2008/0210993 | A1 | 9/2008 | Oshikubo et al. |
| 2008/0211940 | A1 * | 9/2008 | Hynecek ...................... 348/250 |
| 2009/0009645 | A1 | 1/2009 | Schrey et al. |
| 2009/0295971 | A1 * | 12/2009 | Tsuchiya ..................... 348/311 |
| 2010/0118167 | A1 | 5/2010 | Johnson |
| 2010/0253833 | A1 | 10/2010 | Deever et al. |
| 2011/0019044 | A1 | 1/2011 | Wang et al. |
| 2011/0128425 | A1 | 6/2011 | Schemmann et al. |
| 2011/0279725 | A1 | 11/2011 | Cazaux et al. |
| 2011/0298956 | A1 | 12/2011 | Giffard et al. |
| 2012/0206634 | A1 | 8/2012 | Katzir et al. |

OTHER PUBLICATIONS

Cheng et al., "Time-Delay Integration readout with adjacent pixel signal transfer for CMOS image sensor", 2012 International Symposium on VLSI Design, Automation, and Test (VLSI-DAT); 4 pages.

Spartiotis et al., "X- and Gamma Ray Imaging Systems based on CdTe-CMOS Detector Technology," IEEE Nuclear Science Symposium Conference Record, 2008, pp. 518-522.

Benoit Giffard et al., U.S. Appl. No. 13/152,333, filed Jun. 3, 2011.

Jun. 6, 2013 Office Action issued in U.S. Appl. No. 13/152,333.

Yvon Cazaux et al, U.S. Appl. No. 13/103,492, filed May 9, 2011.

Yvon Cazaux, U.S. Appl. No. 13/978,792, filed Jul. 9, 2013.

Aug. 23, 2012 French Search Opinion issued in European Application No. 11354031.4 (with translation and translator certification).

Farrier et al., "A Large Area TDI Image Sensor for Low Light Level Imaging," *IEEE Journal of Solid-State Circuits*, Aug. 1980, vol. SC-15, No. 4, pp. 753-758.

Lepage et al., "Time-Delay-Integration Architectures in CMOS Image Sensors," *IEEE Transactions on Electron Devices*, Nov. 2009, vol. 56, No. 11, pp. 2524-2533.

Oct. 3, 2013 Office Action issued in U.S. Appl. No. 13/152,333.

\* cited by examiner

CMOS LINEAR IMAGE SENSOR WITH MOTION-BLUR COMPENSATION

BACKGROUND OF THE INVENTION

The invention relates to a linear image sensor designed to capture an image by scanning, and in particular to a Time Delay and Integration (TDI) sensor.

STATE OF THE ART

The principles of a TDI image sensor are described for example in the article entitled "A Large Area TDI Image Sensor for Low Light Level Imaging" by Michael G. Farrier et al—IEEE Journal of Solid-State Circuits, Vol. SC-15, No. 4, August 1980.

A TDI sensor is generally used to capture the image of an object moving at high speed and observed under poor lighting conditions. It is generally produced using CCD (Charge-Coupled Device) technology which has so far enabled the best performances in terms of sensitivity to be obtained.

FIG. 1 schematically represents a CCD-technology TDI sensor as described in the above-mentioned article. It comprises a matrix of photosensitive sites, or photosites 10, the rows of which are generally, as represented, considerably longer than the columns. In the example of the above-mentioned article, a row comprises 1028 photosites, whereas a column only comprises 128. For earth photography via satellite, a row can comprise some 12,000 photosites and the matrix comprises several tens of rows.

The rows of the matrix are arranged perpendicularly to the motion of the object whereof the image is to be captured. Motion of this image relative to the sensor is represented by descending arrows. These arrows also correspond to movement of the electric charges in the CCD registers, in synchronism with the motion of the image.

Each row captures a corresponding slice of the object during an exposure time compatible with the speed of the image. This results in an accumulation of negative charges (electrons) in the photosites of the row.

When a slice of the image captured by a row i is moved to the level of row i+1, the charges accumulated in row i are transferred to row i+1, which, during a new exposure time, continues to accumulate charges for the same slice. Charge transfers from one row to the next therefore take place in synchronism with motion of the image.

At each transfer cycle, the last row of the matrix thus contains the sum of the charges accumulated by all the rows for one and the same slice. The sensitivity of the sensor is therefore in theory multiplied by the number of rows.

At the end of each charge transfer and exposure cycle, the charges of the last row of the matrix are transferred into a shift register 12 the purpose of which is to read the data of the last row. The charges stored in the photosites of this register are shifted photosite by photosite to a charge-voltage converter 14 at the end of the row where a voltage corresponding to the total charge of each photosite can be collected by a processing circuit, generally external to the sensor.

As the CCD technology is less and less used for image sensors to the profit of the CMOS technology, the use of the latter technology is envisaged for TDI sensors.

The article entitled ["Time-Delay-Integration Architectures in CMOS Image Sensors" by Gerald Lepage, Jan Bogaerts and Guy Meynants—IEEE Transactions on Electron Devices, Vol. 56, N° 11, November 2009] describes solutions for obtaining the TDI functionality by means of a CMOS image sensor.

In a CMOS image sensor, light is also captured in the form of charges at pixel level. However, as each pixel is provided with its own voltage read circuit, charges cannot be transferred from one pixel to another.

FIG. 2 schematically represents an architecture envisaged in this article by Lepage et al. A matrix 10' of N×M pixels Px is associated with a matrix 16 of memory cells Σ of the same size and configuration (here N×M=5×5).

In principle, pixel matrix 10' takes views at a rate corresponding to the time (called "line time" $T_L$) taken by an image slice to scan the pitch of the rows of pixels. Thus, after N line times, the same image slice will have been captured by each of the N rows of the pixel matrix. Each row of memory 16 is temporarily associated with the same slice of the image. The brightness levels recorded for this slice by all the rows of pixels is accumulated therein. Once the levels have been accumulated for the slice, the memory row is read, reset, and associated in circular manner with a new image slice.

It is thus observed that accumulation of all the rows of the pixel matrix has to be performed at each line time.

Whereas in CCD technology the brightness level accumulation operations correspond to simple charge transfers, in CMOS technology these operations are notably more complex. They involve multiplexing operations on pixel read busses, analog-to-digital conversions, addition operations, and memory access operations. This results in difficulties in CMOS technology to achieve the same view capture rates (or line time $T_L$) as in CCD technology. The resolution of the pixel matrix in number of rows therefore has to be adjusted to the minimum line time envisaged and to the required pixel pitch.

In certain applications, as described in particular in the above-mentioned article by Lepage et al., it is desirable to spatially oversample the image in the direction of motion to improve what is referred to as the image motion Modulation Transfer Function (MTF), representative of the sharpness of the reproduced image. This involves increasing the number of rows of pixels while at the same time reducing the pitch to preserve the dimensions of the sensor. The temporal constraints thus increase with the square of the subdivision factor.

For certain applications, it is further desirable for the pixels to have an anti-blooming function enabling excess charges to be removed under strong brightness conditions. Excess charges are evacuated by supply lines instead of overflowing into the neighbouring pixels.

SUMMARY OF THE INVENTION

It is observed that a need exists to provide a CMOS TDI image sensor enabling the motion MTF to be improved, without notably increasing the temporal constraints, and enabling an anti-blooming function to be performed.

This need tends to be satisfied by providing a time-delay-integration image sensor comprising a matrix of photosensitive pixels organized in rows and columns, each pixel of a column comprising a photosensitive element, a storage node, and a first transfer transistor connecting the photosensitive element to the storage node. Each pixel of a column, except for the last one, further comprises a second transfer transistor connecting the storage node of the pixel to the photosensitive element of the next pixel of the column. The two transfer transistors are connected to be active at the same time. Each pixel further comprises a reset transistor connecting the storage node of the pixel to a power supply potential.

The anti-blooming function is obtained by commanding this sensor according to the following steps:

a) periodically activating the first and second transfer transistors of each pixel to cause a charge transfer to the storage node of the pixel;

b) reading the potential on the storage node of the pixel after each activation of the first and second transfer transistors;

c) in an interval comprised between two successive activations, setting the gate of the transfer transistors to a polarization potential defining an anti-blooming threshold of the photosensitive elements;

d) turning the reset transistor of the pixel on during said interval;

e) turning the reset transistor off outside said interval.

The above steps are implemented with an offset of one half-period between the pixels of even rank and the pixels of odd rank of a column.

According to one embodiment, a first read of the potential on the storage node is performed between the beginning of turn-off of the reset transistor and activation of the transfer transistors of the pixel; and a second read of the potential on the storage node is performed between activation of the transfer transistors and the end of turn-off of the reset transistor.

The duration of said interval is preferably comprised between one half-period and one period.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED
EMBODIMENT OF THE INVENTION

In order to increase the image motion MTF, it is proposed to subdivide each pixel into two (or even more), as has already been proposed in the prior art, but a particular pixel matrix architecture is further provided limiting the increase of the temporal constraints to the value of the subdivision factor, instead of increasing them with the square of the subdivision factor. Thus, by subdividing each pixel in two, the time constraints only increase by a factor 2 only, instead of 4.

This is obtained by increasing the temporal resolution of the sensor without increasing its spatial resolution. What is meant by "temporal resolution" is the number of measurements made per time unit, whereas what is meant by "spatial resolution" is the number of measurements made per distance unit. Increasing the temporal resolution enables the motion MTF to be improved, whereas keeping the spatial resolution limits the resources required to process the image. The temporal resolution is increased by subdividing each pixel, in the direction of motion, into several sub-pixels covering the same surface as the pixel. The spatial resolution is preserved by aggregating the values of a sliding group of consecutive sub-pixels corresponding to the size of a pixel in a single value. This group "slides" at the same rate of speed as the image, i.e. it shifts at a rate of one pixel in one line time. To effectively increase the temporal resolution, a new aggregation takes place each time the group has shifted by one sub-pixel.

Figure 3:
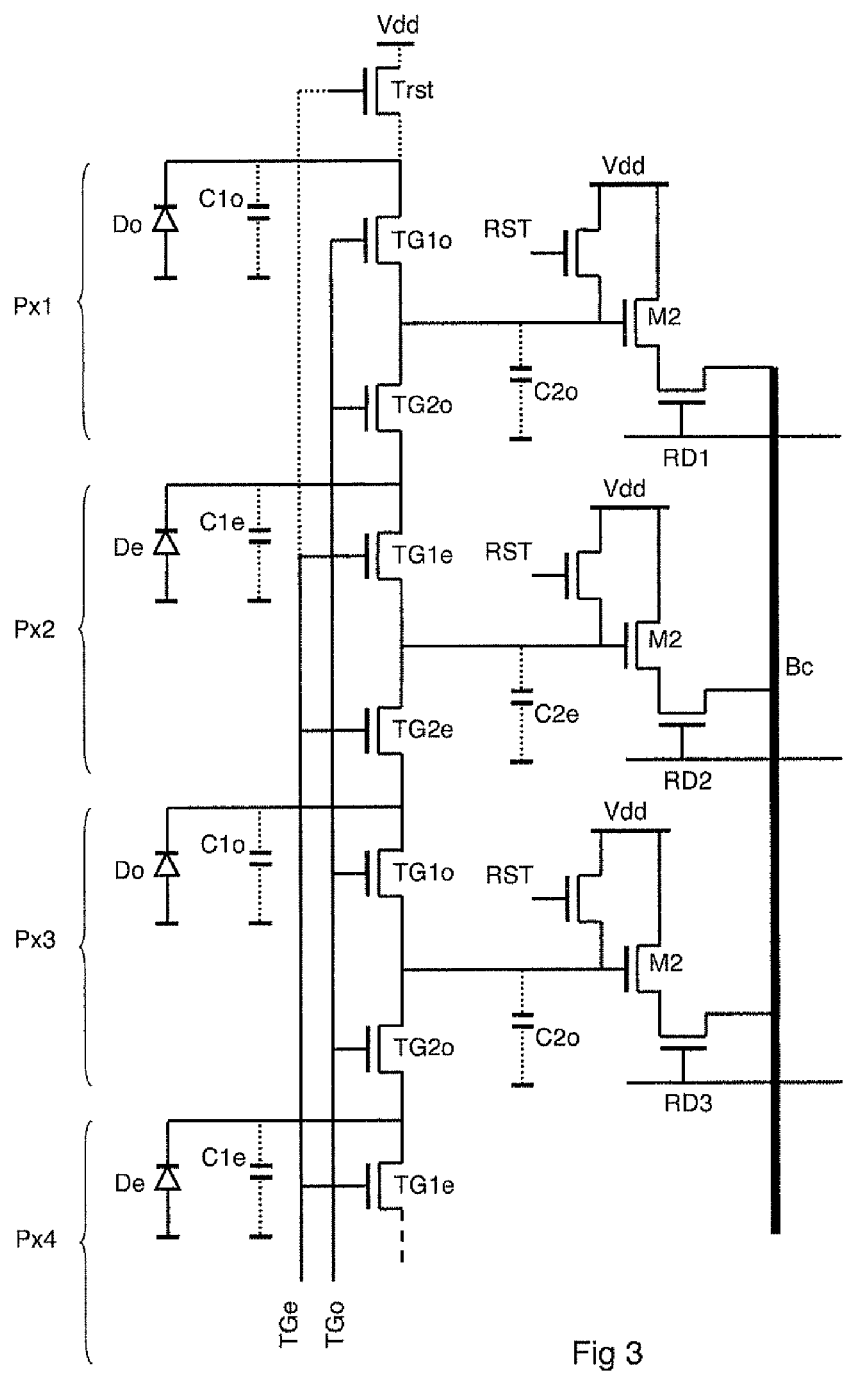
FIG. 3 schematically represents an embodiment of a CMOS TDI sensor enabling the motion MTF to be improved.

FIG. 3 schematically represents the first pixels of a column of an embodiment of a TDI sensor in CMOS technology whereby this principle can be implemented. This sensor is a global shutter sensor (snapshot), i.e. all the pixels of the sensor perform an integration at the same time.

In the sensor embodiments described in the following for example purposes, each pixel is subdivided in two in the direction of motion to increase from a motion MTF of 0.64 to 0.9.

Each pixel Px comprises a photodiode D having an intrinsic capacitance or integration capacitance C1 enabling the charges generated by the light striking the pixel to be accumulated. A transfer transistor TG1 connects photodiode D1 to the gate of a follower transistor M2. The gate capacitance of transistor M2 and also the capacitances of the other components connected to the gate of transistor M2 form a buffer capacitance C2, or storage node. A read transistor RD connects the source of follower transistor M2 to a column bus Bc. Read transistors RD of the pixels of a row are commanded by a selection line common to the row. A reset transistor RST connects capacitance C2 to a positive power supply line Vdd.

For the sake of convenience, the control signals of the transistors have the same name as the transistors in the following. Furthermore, the references of certain elements of the odd pixels have a suffix "o" whereas the references of the same elements of the even pixels have a suffix "e".

This type of pixel, as described up to now, is a conventional pixel of "4T" type enabling a snapshot sensor to be achieved, i.e. a sensor enabling all its pixels to be exposed at the same time and enabling the levels of the pixels to be read successively after exposure. Operation is in short as follows.

Initially, transistors TG1, RST and RD are off. Capacitance C1 integrates the charges generated by the light striking photodiode D. Before the end of exposure, transistor RST is briefly actuated to reset buffer capacitance C2. At the end of exposure, transistor TG is briefly actuated to transfer the charges from capacitance C1 to buffer capacitance C2. This transfer is total in the case where photodiode D is of "pinned" type, which results in reset of capacitance C1 for a new exposure phase.

During each exposure phase, the voltage level corresponding to the previous exposure is stored on buffer capacitance C2. This voltage level can be transferred at any time onto bus Bc by actuating read transistor RD, before a new reset is performed by transistor RST.

Compared with a conventional "4T" pixel, each pixel of FIG. 3 comprises an additional transfer transistor TG2 connecting capacitor C2 of the pixel to photodiode D of the next pixel of the column (the last pixel of the column will be devoid of such an additional transfer transistor). Transfer transistors TG1 and TG2 of the same pixel are controlled synchronously—for this their gates receive the same control signal. The two transfer transistors TG1o and TG2o of all the odd pixels are preferably controlled synchronously via a single line TGo, whereas the two transfer transistors TG1e and TG2e of all the even pixels are preferably controlled synchronously via a single line TGe.

It may be desired for the first pixel Px1 of the column to behave in exactly the same way as the other pixels. For this, a reset transistor Trst is for example connected between the photodiode of pixel Px1 and line Vdd. This transistor Trst is activated by control line TGe of the even pixel transfer transistors. Capacitor C1 of pixel Px1, the charge of which is not transferable to a capacitor C2 of a previous pixel, is thereby reset at the time the even pixel transfer transistors are commanded.

Furthermore, the last pixel of the column is a conventional pixel—it does not comprise a second transfer transistor TG2, as there is no following pixel to which this transistor can be connected.

Figures 4A, 4B:
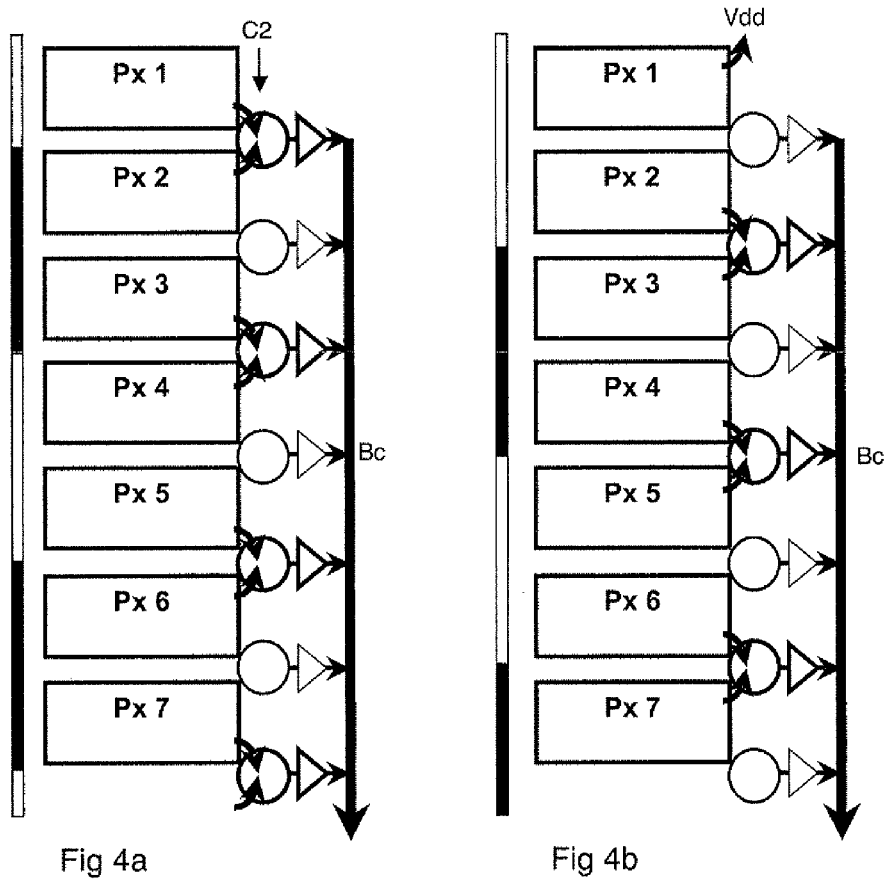
FIGS. 4a and 4b symbolize a sensor of the type of FIG. 3 in two measuring phases.

FIGS. 4a and 4b represent a column of pixels of the type of FIG. 3 with two phases of operation of the sensor. The column is parallel to the motion of the image. The circles represent capacitors C2 and the triangles represent the read circuits (transistors M2 and RD).

The figures correspond to the case where the temporal resolution is divided by two. Each pixel represented is thus in fact a sub-pixel, and two consecutive sub-pixels of the column, which will be designated as "pair of pixels", form a single pixel with the original spatial resolution. As represented, a pair of pixels preferably occupies a square surface, and each pixel is twice as wide as it is high so that the original form factor is preserved.

Facing the column, in the form of a vertical bar, a reference image, or test pattern, has been represented scrolling downwards. The test pattern comprises an alternation of light and dark slices at the pitch of the pair of pixels, i.e. at the Nyquist limit for the original spatial resolution. Each slice thus has the height of a pair of pixels and scans the pair of pixels in a line time $T_L$.

In FIG. 4a, the first dark slice of the test pattern has passed in front of the first two pixels Px1 and Px2 of the column, whereas the first light slice has passed in front of the next two pixels Px3 and Px4 of the column. This configuration is repeated all along the column.

As represented by arrows, the two transfer transistors of each of the odd pixels are activated, thereby the charges integrated by the photodiodes of pixels Px1 and Px2, which have both seen the first dark slice of the test pattern, are summed in first capacitor C2, whereas the charges integrated by the photodiodes of pixels Px3 and Px4, which have both seen the first light slice of the test pattern, are summed in third capacitor C2. This configuration is repeated all along the column so that each capacitor C2 of odd rank, i.e. each capacitor C2o, receives the sum of the charges of the neighbouring pair of pixels.

The voltage levels of capacitors C2o will be read in turn on column bus Bc during the next half line time during which a new integration begins on the photodiodes.

In FIG. 4b, corresponding to one half line time later, the first dark slice of the test pattern has shifted by one pixel downwards and has scanned pixels Px2 and Px3, whereas the first light slice has scanned the next two pixels Px4 and Px5. This configuration is repeated all along the column.

As represented by arrows, the two transfer transistors of each of the even pixels are activated, thereby the charges integrated by the photodiodes of pixels Px2 and Px3, which have both seen the first dark slice of the test pattern, are summed in second capacitor C2, whereas the charges integrated by the photodiodes of pixels Px4 and Px5, which have both seen the first light slice of the test pattern, are summed in fourth capacitor C2. This configuration is repeated all along the column so that each capacitor C2 of even rank, i.e. each capacitor C2e, receives the sum of the charges of the neighbouring pair of pixels.

The voltage levels of capacitors C2e will be read in turn on column bus Be during the next half line time. The voltage levels of odd capacitors C2o will have been read during the current half line time.

It can be observed that the same slice of image is thus able to be sampled every half line time, i.e. a temporal resolution twice as high is achieved, by using at each sampling a pair of pixels whereof the information is aggregated, i.e. the spatial resolution is not increased.

This results, as can be ascertained with the help of FIGS. 4a and 4b, in the number of levels to be read on the bus during a line time being proportional to the subdivision factor, instead of being proportional to the square of the subdivision factor. If the levels of the pixels had to be read individually on bus Be, there would be twice as many reads to perform for each of FIGS. 4a and 4b, i.e. at each half line time.

Figure 5:
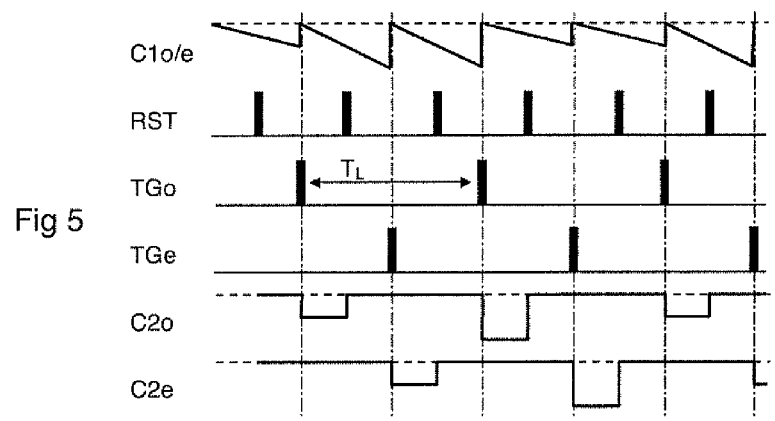
FIG. 5 is a timing diagram illustrating an operation of a sensor of the type of FIG. 3.

FIG. 5 is a timing diagram illustrating an example of the variations of the main signals relative to pixels Px1 and Px2 in the course of the phases of FIGS. 4a and 4b, and of the subsequent phases. The timing diagram is subdivided, by vertical mixed lines, into periods equal to a half line time.

The first signal is representative of the aferage charge states of capacitors C1 of pixels Px1 and Px2. It will be observed that a zero charge level of capacitors C1 and C2 corresponds to a high potential (for example Vdd), whereas an increasing charge level corresponding to an increasing number of electrons varies in decreasing manner from high potential.

In the course of the first half line time corresponding to FIG. 4a, pixel Px1 sees a transition from the dark slice to a light slice and pixel Px2 sees the dark slice throughout the half line time. Capacitors C1 of pixels Px1 and Px2 charge at weak levels.

Before the end of the first half line time, signal RST is activated to reset capacitors C2. Such a reset is repeated with a period of a line time or preferably of a half line time, as is represented.

Activation of signal RST can take place at any time within a half line time. It is preferably activated, as represented, towards the middle of each half line time, which will enable correlated double sampling to be performed to compensate the black level noise. Thus, between activation of RST signal and the end of the half line time, the black levels are transferred from capacitors C2 to bus Bc so as to be able to subtract these levels from the useful levels transferred in the following phase.

At the end of the first half line time, the transfer transistors pairs TGo of odd pixels are activated. The charges of capacitors C1 of pixels Px1 and Px2 are transferred and summed in capacitor C2o of pixel Px1, the voltage level of which presents a stage of corresponding amplitude (weak here).

Transistors TGo are subsequently activated periodically with a period of one line time.

In the course of the second half line time corresponding to FIG. 4b, capacitors C1 of pixels Px2 and Px3 see what pixels Px1 and Px2 saw at the previous half line time. Capacitors C1 of these pixels (level not represented for pixel Px3) charge to low levels. Pixel Px1 seeing a light slice throughout this time, capacitor C1 charges to high level.

At the end of the second half line time, transfer transistors pairs TGe of the even pixels are activated. The charges of capacitors C1 of pixels Px2 and Px3 are summed in capacitor C2e of pixel Px2, the voltage level of which presents a stage of corresponding amplitude (again weak).

Transistors TGe are subsequently activated periodically with a period of one line time.

In the course of the third half line time, capacitors C1 of pixels Px1 and Px2 that see a light slice roll, charge to high levels.

At the end of the third half line time, transfer transistor pairs TGo of odd pixels are again activated. The charges of capacitors C1 of pixels Px1 and Px2 are summed in capacitor C2o of pixel Px1, the voltage level of which presents a stage of corresponding amplitude (high this time).

The half line times thus follow on from one another in similar manner. It can be observed that the levels on capacitors C2 present a substantial periodic variation with a period of a line time, corresponding to the pitch of the test pattern.

By increasing the temporal resolution by a factor 2, without affecting the spatial resolution, the motion MTF is in this way increased from 0.64 to 0.9.

The principle described is valid for any subdivision factor N, although factors of more than 2 do not substantially improve the motion MTF (0.955 is obtained for a factor 3 and 0.975 for a factor 4).

To increase the temporal resolution by a factor N, which will also increase the temporal constraints by a factor N (instead of $N^2$), each pixel of FIG. 3 comprises a transfer transistor TG1 connecting photodiode D to pixel storage capacitor C2, and N−1 additional transfer transistors (TG2, TG3 ... TON) connecting storage capacitor C2 to the respective photodiodes of the following N−1 pixels. These N transfer transistors of the pixel are able to be activated at the same time to sum the charges of N photodiodes of the N-uplet of pixels thus formed in pixel storage capacitor C2. A bus with N transfer transistor control lines is provided, the line of rank i being activated at a time $iT_L/N$ of each line time, and controlling the transfer transistors of the pixels of ranks i+kN, where k=0, 1, 2, . . . .

Figure 6:
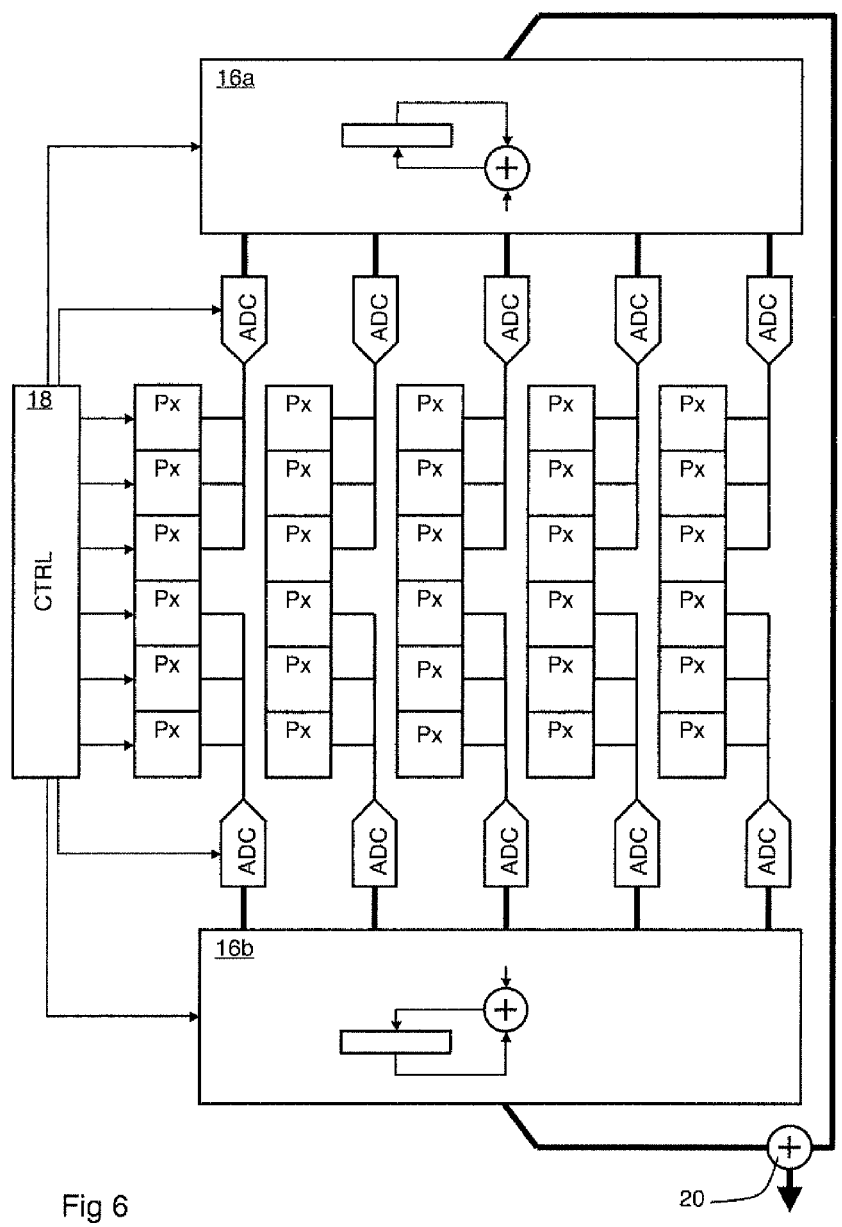
FIG. 6 represents an embodiment of a TDI image sensor enabling the temporal constraints to be further reduced.

FIG. 6 represents an architecture of a CMOS TDI sensor providing an optional solution enabling the temporal constraints to be further reduced by a factor 2, in the scope of a global shutter sensor. By combining this solution with that which has just been described (with N=2), a CMOS TDI sensor is able to be provided having an excellent image motion MTF without having temporal constraints that are more difficult to meet than for a conventional sensor.

It is proposed by means of this architecture to divide by two the time necessary for the accumulation operations of the brightness levels in memory. An important factor in temporal constraints is in fact the time necessary to accumulate a current brightness level with a stored value in an architecture of the type of FIG. 2.

Two independent accumulation channels each associated with a separate memory are provided, for each column of pixels, which are used in simultaneous or quasi-simultaneous manner. The accumulation channels are used in simultaneous or quasi-simultaneous manner.

In general manner, an accumulation memory 16a is associated with a first half of the rows, and a separate accumulation memory 16b is associated with the second half of the rows. It is thus possible to write a value corresponding to a pixel of the first half in memory 16a at the same time as a value corresponding to a pixel of the second half is written in memory 16b.

In FIG. 6, the matrix of photosensitive pixels Px is represented with six rows and five columns, for example purposes. Accumulation memory 16a is here associated with the rows of the top half of the pixel matrix, and accumulation memory 16b is associated with the rows of the bottom half of the pixel matrix. The pixels of the top half and the pixels of the bottom half of each column are connected by separate read busses to their respective memories 16a and 16b. An analog-to-digital converter ADC is provided in each of these busses. The analog levels provided by the pixels are thus converted into digital before being accumulated in memories 16a and 16b.

For example, accumulation takes place, as shown on the figures, at the level of the memories by means of an adder which replaces the content of a memory cell by the sum of this content and the value provided by the corresponding converter ADC.

Accumulation memories 16a and 16b and pixels Px are managed by a control circuit 18, whereof the operation will be described in further detail further on.

The contents of memories 16a and 16b are accessible by respective busses arriving on the two inputs of an adder 20. One adder 20 is in fact provided per column serving the purpose of completing the partial accumulations made in each of memories 16a and 16b.

Each of accumulation memories 16a and 16b preferably has the same configuration as the pixel matrix, i.e. it is in the form of a matrix of memory cells of six rows by five columns in the example represented. Furthermore, as represented, memories 16a and 16b are preferably physically arranged on each side of the pixel matrix, in the direction of the columns. This facilitates routing of the connections.

Figure 1:
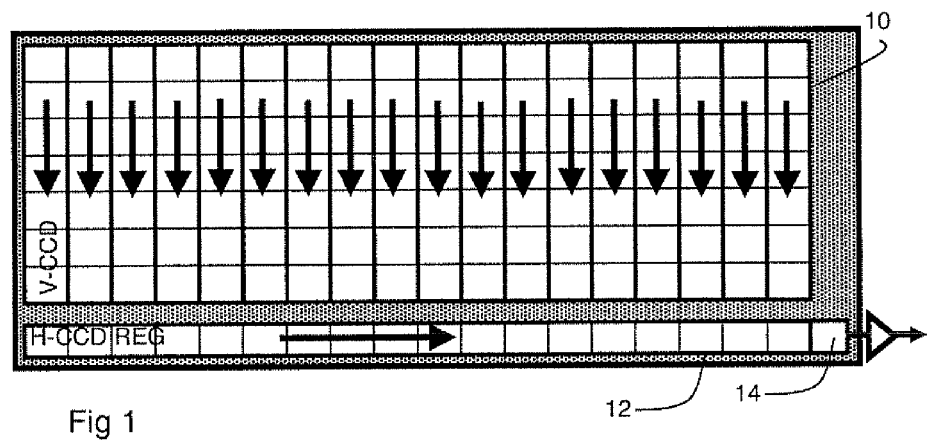
FIG. 1, described in the above, schematically represents a conventional TDI image sensor in CCD technology.
Figure 2:
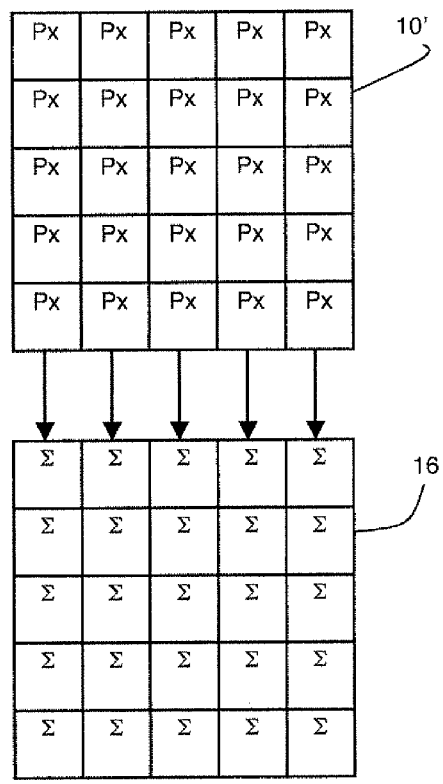
FIG. 2, described in the above, schematically represents a conventional TDI image sensor in CMOS technology.

With respect to the conventional configuration of FIG. 2, the memory size is doubled. This does not have a notable influence on the size of the sensor, as the latter generally comprises much less rows than columns. A relatively small number of memory rows are thus added which have little effect on the width of the sensor with respect to the other components of the sensor, in particular the input/output bumps.

In certain applications, it is desirable for the pixels to have an anti-blooming function enabling, under strong brightness conditions, excess charges to be removed to the power supply lines rather than to let them overspill to the neighbouring pixels. This function is usually available in conventional pixels with five transistors, or "5T". In such a pixel, the fifth transistor, of N type, is connected between the photodiode and the power supply potential Vdd, and its gate is polarized to a fixed potential adjusted so that the transistor turns on as soon as the potential of the photodiode (connected to the source of the transistor) drops below a blooming threshold. This polarization potential, with current technologies, is slightly positive, about 200 mV.

A simple means of providing an anti-blooming function in the sensor of FIG. 3 is to add a transistor in each pixel between the photodiode and the potential Vdd. This nevertheless increases the complexity of the pixels and reduces the size of the photodiode.

It is observed that the structure of FIG. 3 circumvents the need for an anti-blooming transistor by commanding transfer transistors TG and reset transistors RST in judicious manner.

The anti-blooming function is in fact achieved by turn-on of the transistor RST of the pixel, and by simultaneously applying the polarization voltage setting the blooming threshold to the gate of transistor TG1 of the pixel. The excess charges of the photodiode can then be evacuated to potential Vdd by transistor TG1 and transistor RST.

However, this control of transistors TG1 and RST of the pixel, at least during the whole of the photodiode integration period where the anti-blooming function is desirable, is not compatible with the control method of the whole of the sensor, illustrated in FIG. 5.

It can be ascertained that it is however possible to perform the anti-blooming function in permanent manner by making use of the fact that the even rank pixels and the odd rank pixels are controlled with a shift.

Figure 7:
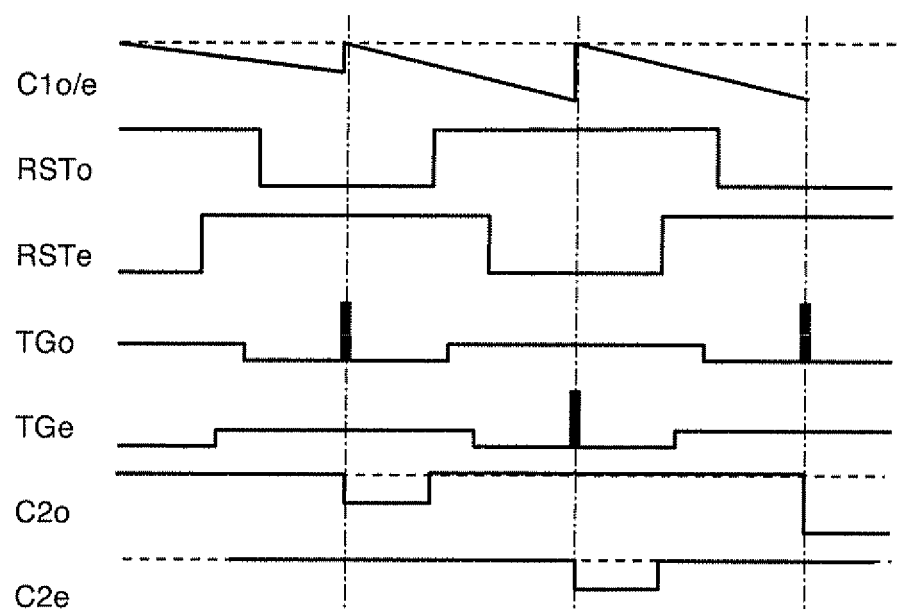
FIG. 7 is a timing diagram illustrating a variant of operation of a sensor of the type of FIG. 3 providing an anti-blooming function.

FIG. 7 illustrates how.

At the beginning of a first integration phase on the photodiodes of the sensor, transistors RST of the odd pixels, noted RSTo, are on. This results in storage nodes C2o of the odd pixels being maintained in the discharge state. Transistors RST of the even pixels, noted RSTe, are off, enabling transfer of charges from the photodiodes to even storage nodes C2e, and read of the latter. At the same time, the gates of transistors TG1o and TG2o of the odd pixels are at their anti-blooming level, about 200 mV with current technologies. Transistor TG1o therefore performs the anti-blooming function for the odd pixel by means of transistor RSTo of the pixel.

Transistor TG2o is in fact polarized in the same way as transistor TG1o, as the gates of these two transistors are connected to one another. This transistor TG2o therefore performs the anti-blooming function for the next even pixel, also via transistor RSTo. Transistors TG1e and TG2e of this next even pixel are off and cannot in any case act as anti-blooming transistors, as transistor RSTe of this pixel is off. Storage node C2e can on the other hand receive the charges of photodiode De/C1e and be read by means of read transistor RD of the pixel.

Thus, in this configuration where only the odd pixels are monopolised by their active reset transistors, the anti-blooming function is nevertheless performed for all the pixels without adding any additional components.

Near to the middle of the integration period, even transistors RSTe are turned on whereas odd transistors RSTo are turned off. Odd transistors TGo (TG1o and TG2o) are off, whereas transistors TGe (TG1e and TG2e) are in turn polarized to perform the anti-blooming function.

Preferably, as represented on an enlarged scale, transistors RSTo and RSTe present a common turn-on phase of short duration (between 0.1 and 2 μs), within which transistors TGo and TGe have a common polarization phase at the anti-blooming level. This enables the anti-blooming function only to be kept active during the transition between the integrations of the odd and even pixels.

Following this transition, the sensor is in a configuration where the roles of the odd and even pixels are exchanged to perform anti-blooming. The even pixels are monopolised by the active transistors RSTe and perform the anti-blooming function for all the pixels, via transistors TG1e and TG2e, whereas storage nodes C2o of the odd pixels can receive charges and be read.

At the end of the first integration period of charges in the photodiodes, transistors TGo are briefly activated causing transfer of charges from the couples of adjacent photodiodes to storage nodes C2o of the odd pixels, as was described in relation with FIG. 5.

Transistors RST and TG then remain in the same state up to half of the second integration period when they again switch to the described configuration of the beginning of the first integration period.

At the end of the second integration period, transistors TGe are briefly activated causing transfer of charges from the couples of adjacent photodiodes to storage nodes C2e of the even pixels, as was described in relation with FIG. 5.

Transistors TG and RST are thus commanded in periodic manner with a period of a line time and a shift of a half-period between the even and odd pixels. In other words, a period is the time interval which separates two successive activations of the transfer transistors (and therefore two successive reads of the new pixel) and a half-period corresponds to a half of this period.

With the operation that has just been described, transfer of charges from the photodiode to storage node C2 of each pixel takes place substantially in the middle of an interval, corresponding substantially to a half-period, where transistor RST of the pixel is off. This enables a correlated double-sampling to be performed. During the interval between turn-off of transistor RST and activation of transfer transistors TG, the black levels stored on capacitances C2 of the pixels of the same parity are read. During the interval between activation of transistors TG and the next turn-on of transistors RST, the signal levels stored on capacitances C2 are read. By subtracting outside pixel the black levels from the corresponding signal levels, levels having a better signal-to-noise ratio are obtained by suppression of the pre-charge noise of the read nodes.

The invention claimed is:

1. A method for controlling a time-delay-integration sensor comprising a matrix of photosensitive pixels organized in rows and columns, each pixel of a column comprising:
   a photosensitive element;
   a storage node;
   a first transfer transistor connecting the photosensitive element to the storage node; and
   a reset transistor connecting the storage node of the pixel to a power supply potential, each pixel of a column, except for the last one, further comprising:
   a second transfer transistor connecting the storage node of the pixel to the photosensitive element of the next pixel of the column, the second transfer transistor connected to be active at the same time as the first transfer transistor, the method comprising the following steps in a row of pixels:
   a) blocking the reset transistor of each pixel during a first interval;
   b) periodically activating the first and second transfer transistors of each pixel to cause a charge transfer to the storage node of each pixel, with a period equal to a line time;
   c) reading the potential on the storage node of each pixel after each activation of the first and second transfer transistors;
   d) turning the reset transistor of each pixel on during a second interval so as to maintain the storage node at a reset state; and
   e) setting the gate of the first and second transfer transistors to a polarization potential defining an anti-blooming threshold during at least a part of the second interval,
   wherein the above steps are implemented with a shift of one half of the line time between the even row pixels and the odd row pixels of a column so that a row of pixels realizes an anti-blooming function while at the same time another row is in a reading mode.

2. The method according to claim 1, comprising the following steps:
   performing a first read of the potential on the storage node between the beginning of turn-off of the reset transistor and activation of the transfer transistors of the each pixel; and
   performing a second read of the potential on the storage node between activation of the transfer transistors and the end of turn-off of the reset transistor.

3. The method according to claim 1, wherein the duration of said second interval is comprised between one half of the line time and one line time.

4. The method according to claim 1, wherein steps a) through e) are executed in succession.

* * * * *